United States Patent
Fattinger et al.

(10) Patent No.: US 7,491,569 B2
(45) Date of Patent: Feb. 17, 2009

(54) METHOD FOR MANUFACTURING A PATTERNED BOTTOM ELECTRODE IN A PIEZOELECTRIC DEVICE

(76) Inventors: Gernot Fattinger, Nabburgerstr. 19, Munich (DE) 81737; Klaus Diefenbeck, Klarweinstr. 18, Munich (DE) 81247

( * ) Notice: Subject to any disclaimer, the term of this patent is extended or adjusted under 35 U.S.C. 154(b) by 395 days.

(21) Appl. No.: 11/429,469

(22) Filed: May 5, 2006

(65) Prior Publication Data
US 2007/0254397 A1    Nov. 1, 2007

(51) Int. Cl.
H01L 21/00    (2006.01)

(52) U.S. Cl. .................... 438/53; 257/E21.505

(58) Field of Classification Search ............ 438/53, 438/654; 257/E21.505
See application file for complete search history.

(56) References Cited

U.S. PATENT DOCUMENTS 5,853,601 A * 12/1998 Krishaswamy et al. ........ 216/2
6,635,519 B2 * 10/2003 Barber et al. ............. 438/151
6,794,212 B2 * 9/2004 Lee ............................ 438/48

FOREIGN PATENT DOCUMENTS

DE    102 00 741 A1    7/2003

* cited by examiner

Primary Examiner—Chandra Chaudhari

(57) ABSTRACT

A method for manufacturing a patterned bottom electrode in a piezoelectric device comprises the steps of providing a basic material and producing a layer structure of a conductive material on the basic material. A protective layer is applied on the layer structure over an area. Thereafter, a planarization layer is applied on the protective layer and on the basic material. A portion of the protective layer is then exposed by patterning the planarization layer. Subsequently, the pattern is planarized by removing the portions of the planarization layer remaining outside the portion such that the protective layer laterally abuts on the planarization layer in a flush manner and forms a planar surface. The protective layer is then removed along with a corresponding part of the planarization layer laterally arranged in a flush manner. This results in the layer structure and the remaining planarization layer forming a planar surface.

20 Claims, 4 Drawing Sheets

METHOD FOR MANUFACTURING A PATTERNED BOTTOM ELECTRODE IN A PIEZOELECTRIC DEVICE

CROSS-REFERENCE TO RELATED APPLICATIONS

This application claims priority from German Patent Application No. 10 2006 019 505.1, which was filed on Apr. 26, 2006, and is incorporated herein by reference in its entirety.

FIELD

The present invention relates to the field of piezoelectric resonators, such as, for example, BAW (bulk acoustic wave) resonators, and particularly to a method for manufacturing a patterned highly planar bottom electrode for a piezoelectric resonator. The highly planar bottom electrode manufactured according to the method of the present invention exhibits excellent uniformity in layer deposition and a planar surface of the entire bottom electrode.

BACKGROUND

Radio-frequency filters based on BAW resonators are of great interest for many RF applications. There are two concepts for BAW resonators, on the one hand the so-called thin-film BAW resonator (FBAR), and so-called solidly mounted resonators (SMRs). Thin-film BAW resonators include a membrane on which a layer sequence consisting of a lower electrode, a piezoelectric layer and an upper electrode is arranged. The acoustic resonator is formed by reflection at the upper side and at the lower side of the membrane. In the alternative concept of solidly mounted resonators, an SMR includes a substrate, such as, for example, a silicon substrate, on which the layer sequence consisting of the lower electrode, the piezoelectric layer and the upper electrode is arranged. In order to keep the acoustic waves in the active region in this design, a so-called acoustic mirror is required. It is located between the active layers, i.e. the two electrodes and the piezoelectric layer, and the substrate.

FIG. 2 shows an example of a solidly mounted resonator having a patterned mirror known from the prior art. A substrate 300 is shown, at the upper surface 304 of which an oxide layer 324 is deposited into which a trench or recess 326 is introduced. Further intermediate layers may be provided between the oxide layer 324 and the substrate 300. The acoustic mirror including a layer sequence comprising a first layer $306a_1$ having a high acoustic impedance, a layer $306b$ having a low acoustic impedance and a layer $306a_2$ having a high acoustic impedance is formed in the trench 326. On the surface of the resulting pattern, an insulation layer 308 on at least parts of which the lower electrode 310 is formed is deposited. The portion of the insulation layer 308 not covered by the lower electrode 310 is covered by another insulation layer 328. On the insulation layer 328 and on the lower electrode 310, the piezoelectric layer 312 on parts of the surface of which in turn the upper electrode 318 is formed is formed. The portions of the piezoelectric layer 312 not covered by the upper electrode 318 and parts of the upper electrode 318 are covered by the passivation layer 314. The overlapping regions of the lower electrode 310, the piezoelectric layer 312 and the upper electrode 318 define the BAW resonator 322.

In both concepts for BAW resonators, the deposition of a piezoelectric layer on a patterned bottom electrode is required, the bottom electrode being exemplarily made of a metal. A uniform deposition is thus of crucial importance for the quality of the resonator. To allow a uniform deposition, it is desired to have a highly planar waver surface, i.e. in particular a bottom electrode having a highly planar surface, before depositing the piezoelectric layer. Thus, growth edges in the piezoelectric layer are avoided and a high quality of the piezo material is made possible. This results in a high electromechanical coupling and a high acoustic quality. In addition, subsequent process steps are made easier by a planar surface. This particularly applies to patterning the upper electrode.

In methods known so far, this problem is solved as follows. In order to ensure a planar surface before the piezo deposition, the following steps are taken in processes known so far. At first, the bottom electrode is patterned, wherein the bottom electrode exemplarily is made of a metallic material and the patterning takes place through an etching process. After patterning the bottom electrode, a dielectric planarization layer (exemplarily made of a silicon oxide) having a thickness of roughly the step height after etching the bottom electrode is deposited. This planarization layer is subsequently opened in the region of the bottom electrode so that a rib having a width of exemplarily 1 µm remains at the edge of the bottom electrode. The width of this rib, however, depends on the selection of the etch mask used. In a subsequent oxide CMP (chemical mechanical polishing) step, this rib is polished off, which leaves a planar surface.

This method according to the prior art is problematic in that the oxide CMP step affects the surface of the bottom electrode. This results in a so-called "dishing" effect, a local variation of the electrode thickness. This also results in local variations of the piezo layer thickness deposited on the bottom electrode. Since the resonant frequency of the BAW resonator, except for the material of the piezo layer, is basically given by the layer thickness of the piezo layer, the local variation of the electrode thickness results in a widening of the series resonance of the BAW resonator, resulting in a considerable decrease in the series quality of the BAW resonator.

It would therefore be advantageous to provide a method allowing an improved manufacturing of a patterned bottom electrode in a piezoelectric device.

SUMMARY

Disclosed herein is a method for manufacturing a bottom electrode in a piezoelectric device. In an exemplary embodiment, the method comprises the steps of providing a basic material and providing a layer structure on the basic material. The layer structure comprises a conductive material, and a protective layer is provided on the layer structure. A planarization layer is applied on the protective layer and on the basic material. Following application of the planarization layer, patterning the planarization layer occurs, resulting in a pattern on the planarization layer. A portion of the protective layer is exposed during the patterning process. Thereafter, the planarization layer pattern is planarizing by removing additional portions of the planarization layer in order for the protective layer and the planarization layer to laterally abut in a flush manner and form a planar surface. The protective layer is then removed along with a corresponding part of the planarization layer laterally arranged to the protective layer in a flush manner. The result is a planar surface of the layer structure and the planarization layer.

In one embodiment, removal of the protective layer and the planarization layer laterally arranged to the protective layer in a flush manner involves an etching process. During this process there is an equal removing rate for the planarization layer and the protective layer. Thus, the protective layer may include a material that has the same etching rates as the planarization layer.

The above described features and advantages, as well as others, will become more readily apparent to those of ordinary skill in the art by reference to the following detailed description and accompanying drawings.

BRIEF DESCRIPTION OF THE DRAWINGS

In the subsequent description of certain embodiments of the present invention, same elements or elements having the same effect are provided with the same reference numerals.

DESCRIPTION

Figure 1A:
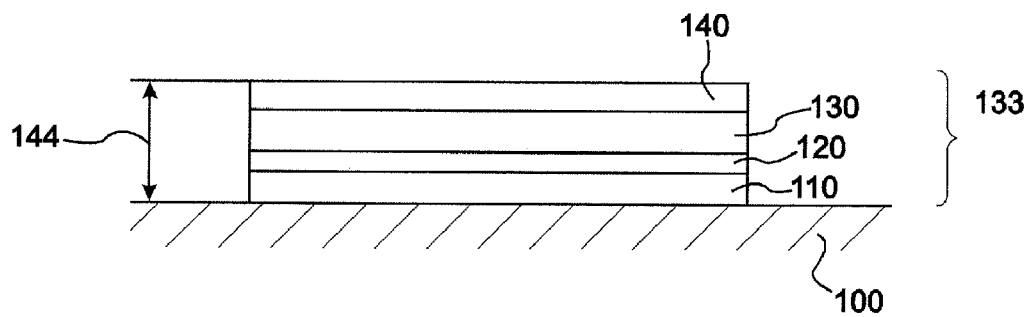
FIGS. 1a-1e show a principle illustration of the process flow for manufacturing a bottom electrode according to the present invention.

A method is disclosed for manufacturing a patterned bottom electrode in a piezoelectric device. In one embodiment, the method includes the steps of: providing a basic material, producing a layer structure of a conductive material on the basic material and producing a protective layer which is deposited on the layer structure over an area, applying a planarization layer on the protective layer and on the basic material, exposing a portion of the protective layer by patterning the planarization layer, planarizing the pattern by removing the portions of the planarization layer remaining outside the portion such that the protective layer laterally abuts on the planarization layer in a flush manner and forms a planar surface, and removing the protective layer and a corresponding part of the planarization layer laterally arranged in a flush manner. In the last step, the corresponding parts of the protective layer and of the planarization layer are removed such that the protective structure and the remaining planarization layer form a planar surface.

In accordance with a second aspect, the present invention provides a method for manufacturing a patterned bottom electrode in a piezoelectric device, having the steps of: providing a basic material, producing a patterned layer sequence consisting of a first metal layer, a second metal layer, a connective layer and a protective layer, the connective layer being applied over an area between the first metal layer and the second metal layer and the first metal layer being applied over an area on the bottom material and the protective layer being applied over an area on the second metal layer, applying a planarization layer on the protective layer and the basic material, exposing a portion of the protective layer by patterning the planarization layer, planarizing the pattern by removing the portions of the planarization layer remaining outside the portion such that the protective layer laterally abuts on the planarization layer in a flush manner and forms a planar surface, and removing the protective layer and a corresponding part of the planarization layer laterally arranged in a flush manner. In the last step, the corresponding parts of the protective layer and the planarization layer are removed such that the patterned layer sequence and the remaining planarization layer form a planar surface.

The present invention is based on the finding that, on the one hand, a protective layer applied on the bottom electrode before the planarization step prevents local variations of the layer thickness of the bottom electrode. Layer thickness variations of this kind are a consequence of a CMP process which is usually employed for planarization. On the other hand, the present invention is based on the finding that the protective layer can be removed in an etch process, for example together with a part of the planarization layer. In this step, it is of advantage to select such materials and/or such an etching process that the protective layer and the planarization layer are etched with equal rates.

The inventive method thus allows planarization of the bottom electrode without affecting the bottom electrode itself. As has been mentioned, this is, on the one hand, achieved by the fact that a (thin) protective layer protecting the bottom electrode from being eroded during a CMP step is applied on the bottom electrode. On the other hand, a procedure of removing this protective layer again is suggested, without re-introducing an essential topology, and thus a bottom electrode having a highly planar surface is obtained. As will be explained in greater detail below, this method is preferably an etching process.

According to the invention, the thin protective layer is applied as a last layer when depositing the bottom electrode material. The bottom electrode may consist of a metal, a layer structure or layer sequence, however, may also be of advantage. This is of particular advantage when the preferred electrode material adheres to the underlying substrate or basic material to an insufficient degree or when this results in undesired reactions and a suitable intermediate layer thus results in a reduction in stress.

In one embodiment, the entire bottom electrode stack, including the protective layer, is patterned in one etching step. After that, conventional planarization by means of a dielectric material takes place. Thus, it is of advantage to select a layer height of the planarization layer corresponding to the layer height of the bottom electrode stack including the protective layer. The bottom electrode material is protected by the protective layer from being eroded in the subsequent CMP step.

Advantageously, an etching step etching the material of the protective layer and the planarization material with equal rates is employed for removing the protective layer. When employing such an etching step, it is to be kept in mind when selecting the materials for the protective layer and for the planarization layer or when designing the etching step (such as, for example, by a suitable selection of the etchant, temperature, pressure, etc.) that the most equal etching rates possible are realized. Furthermore, it is of advantage to select the materials such that the bottom electrode material acts as an etch stop layer for the etching step for removing the protective layer. When the uppermost layer of the bottom electrode material exemplarily comprises tungsten, it is of advantage to select a corresponding etching process stopping at this tungsten layer. The final result is a perfect planar surface and a bottom electrode having a uniform thickness.

In addition, optionally a CMP step may be performed before depositing the protective layer on the bottom electrode stack. The bottom electrode material is smoothed out by this over the entire area to ensure, for example, good growth of a piezoelectric layer of the piezoelectric device to be applied subsequently.

A considerable advantage of the embodiments of the present invention is that a high quality in the series resonance is achieved by protecting the bottom electrode material by the protective layer. This is the case since the entire resonator region reaches the resonant state at nearly the same frequency given by the acoustic thickness. If, on the other hand, the bottom electrode material was affected by a CMP step, a change in the layer thickness of the bottom electrode material would result in a deterioration in the series resonance. The inventive method thus allows manufacturing a BAW resonator of considerably improved quality.

One embodiment of the method disclosed herein will now be discussed in greater details referring to FIGS. 1a-1e.

FIG. 1a shows a basic material 100 on the surface of which a layer structure 133 effective as a bottom electrode after being manufactured is applied. In the example indicated in FIG. 1, the layer sequence comprises three layers, a first metal layer 110, a connective layer 120 and a second metal layer 130. A protective layer 140 which is to protect the layer sequence 133 in the subsequent processing is applied on these three layers.

Optionally, before depositing the protective layer 140, the layer sequence 133 may, if appropriate, be smoothed out by a CMP step in order to ensure, for example, good growth of a piezoelectric layer of the piezoelectric device to be applied subsequently.

In the embodiment shown here, the layer sequence 133 comprises three layers. As has been described above, a layer sequence 133 may be of particular advantage when a preferred electrode material has an insufficient adhesion to the underlying substrate or basic material or when it results in undesired reactions and a suitable layer sequence thus results in a reduction in stress. Exemplarily, the following materials may be used for the layer sequence 133, namely aluminum, TiN (titanium nitride) and tungsten, the protective layer 140 being applied on the tungsten layer and the TiN layer representing a connective layer to the aluminum layer applied on the basic material 100. Silicon nitride (SiN) is a possible material for the protective layer 140 and exemplarily comprises a thickness of 10 to 500 nm (preferably 50 to 100 nm).

When the bottom electrode comprises several layers, these layers may be applied one after the other and the patterning may exemplarily take place by an etching process. Thus, the patterning of the layers may take place only after applying all the layers or, in particular when this is difficult or impossible (if, for example, a corresponding process is not available) the patterning may, however, also take place in succession, i.e. layer after layer. This, for example, is the case when the different layers require different etchants or etching conditions, such as, for example, temperature, pressure, etc.

Using a layer sequence consisting of three layers is not necessarily required for the inventive method. As has already been mentioned, using a layer sequence 133 may be sensible for reasons of processing, the bottom electrode, however, may also consist of only one or two layers according to the present invention.

Figure 1B:
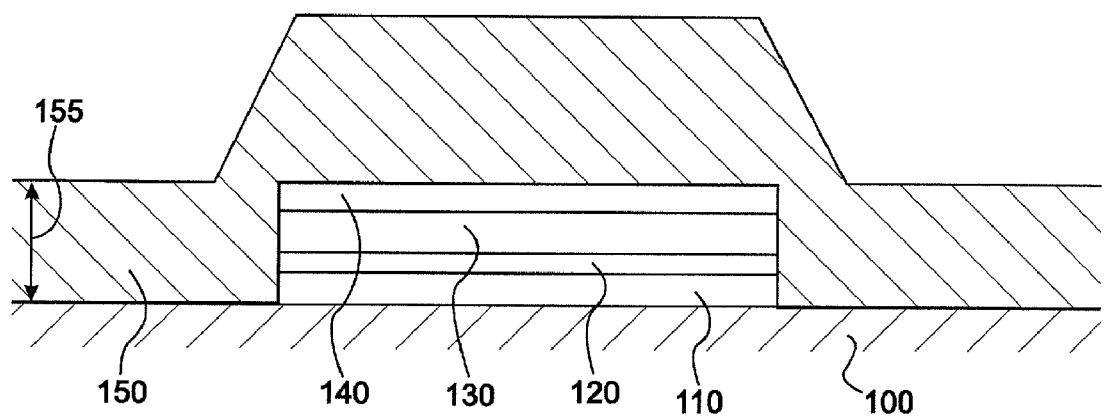

After applying the layer sequence 133, what follows is conventional planarization by applying a dielectric material, typically silicon oxide ($SiO_2$). As is shown in FIG. 1b, a planarization layer 150 is applied on the layer sequence consisting of the layers 110, 120 and 130, together with the protective layer 140. In at least some embodiments, the layer thickness 155 of the planarization layer 150 will correspond to the thickness 144 of the layer sequence 133 and the protective layer 140 and not only cover the protective layer 140, but additionally also cover the basic material 100 at least partly. The planarization layer 150, which exemplarily comprises an oxide material, such as, for example, silicon oxide, is patterned using a suitable mask, such as, for example, a resist mask or a hard mask, to define the portions 170 of the planarization layer 150 to be removed in a subsequent step.

Figure 1C:
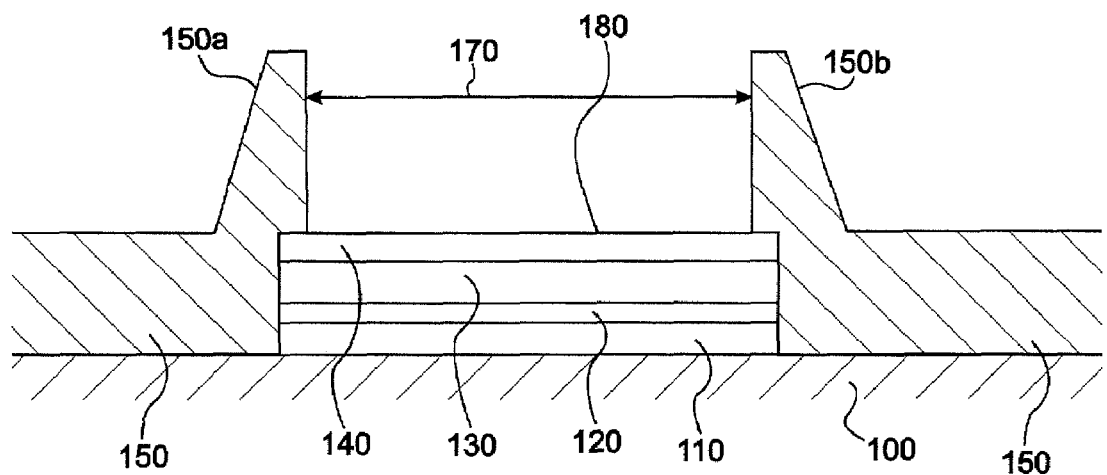

FIG. 1c shows the result of exposing the portion 170 of the planarization layer 150, which may exemplarily take place by an etching process. When removing the portion 170 of the planarization layer 150, a surface 180 of the protective layer 140 is exposed and ribs 150a and 150b of the patterned planarization layer 150 will remain only in the edge region. The portion 170 preferably includes at least the active region of the piezoelectric resonator, wherein the region 170, for reasons of adjusting tolerance and possible inclined etching flanks, is selected to be somewhat greater than the actual active region of the piezoelectric resonator resulting. It is also of advantage for the region 170 not to reach laterally beyond the protective layer 140, i.e. for the surface 180 to only include parts of the surface of the protective layer 140. In this case, the protective layer 140 may exemplarily serve as an etch stop layer when removing the planarization layer 150 in the region 170. Otherwise, i.e. when the region 170 laterally reaches beyond the protective layer 140, removing the planarization layer 150 in the region 170 might result in trenches (not shown in the figures) laterally from the protective layer 140. When applying the piezo layer on the layer sequence 133, trenches of this kind would again limit the quality of the resonator.

Figure 1D:
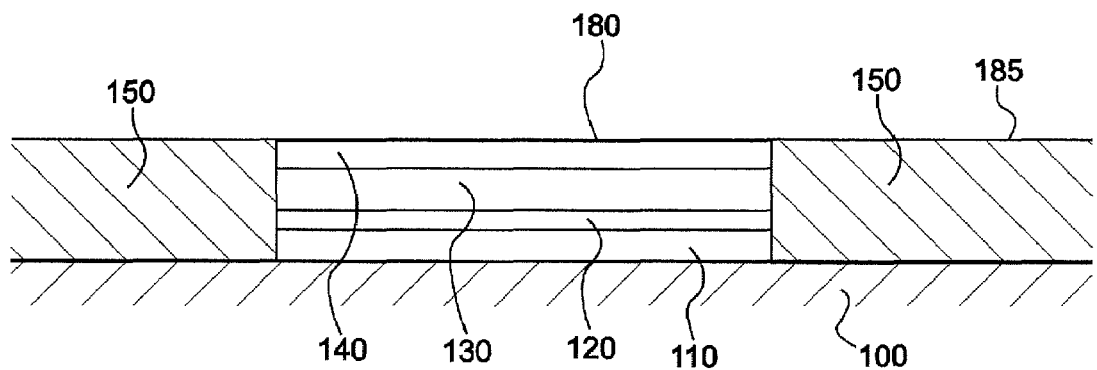

Subsequently, the pattern shown in FIG. 1c is subjected to a planarization process where the ribs 150a and 150b are removed, exemplarily by a CMP process. The pattern resulting is shown in FIG. 1d and, in the ideal case, has a planar surface. In particular, the surface 180 of the protective layer 140 should essentially be flush with a surface 185 of the remaining portions of the planarization layer 150. However, only the planarization layer 150 and the protective layer 140 are affected by the CMP process, but not the layer sequence 133 which is protected by the protective layer 140. The result is a considerable advantage of the embodiment of the present invention, namely that the layer sequence 133 and thus the bottom electrode to be are protected by the protective layer 140 from being eroded, and thus the CMP process does not result in local variations of the layer thickness of the bottom electrode.

Figure 1E:
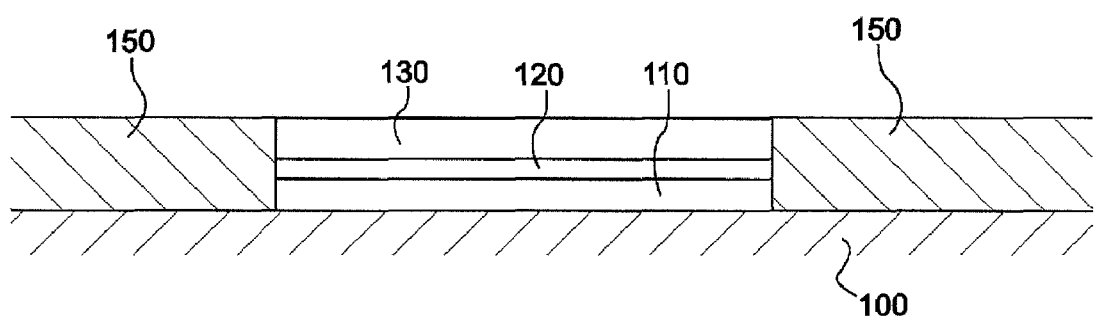
Figure 2:
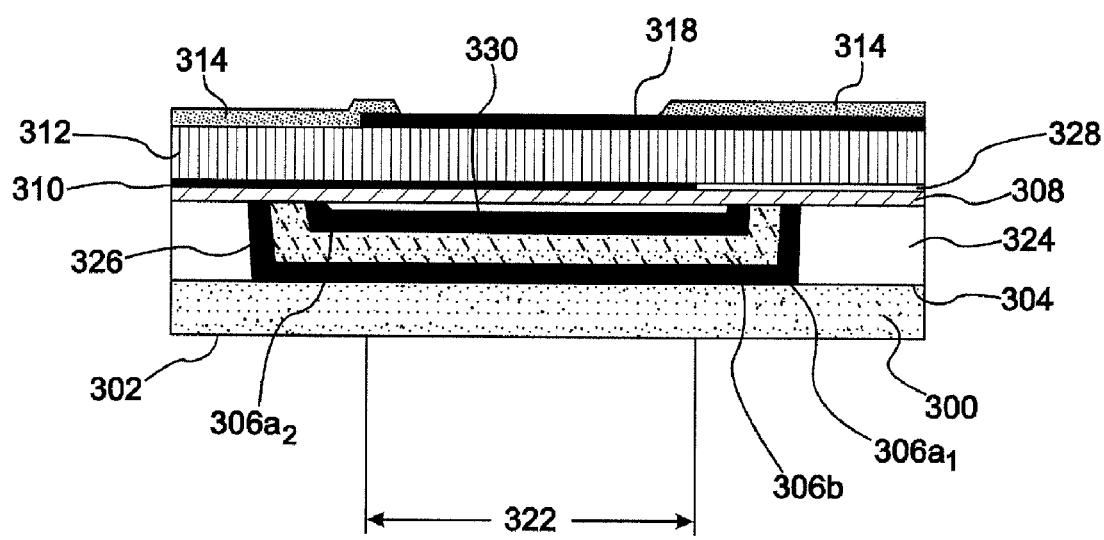
FIG. 2 shows a solidly mounted resonator having a patterned mirror of the prior art.

In a final step, the protective layer 140 is removed. The result is shown in FIG. 1e, where not only the protective layer 140, but also a part of the planarization layer 150 are eroded. Preferably, an etching step etching the material of the protective layer 140 and the material of the planarization layer 150 at equal rates is employed for this process for removing the protective layer 140. This is, for example, possible for silicon nitride and silicon oxide and provides, as a result, a nearly perfect planar surface and a nearly uniformly thick bottom electrode. Consequently, in at least one embodiment it is advantageous to not only select a corresponding etching process, but also to select the materials of the protective layer 140 and the planarization layer 150 such that they comprise etching rates which are as equal as possible with regard to the etching process selected. The resulting layer sequence 133 of the bottom electrode thus, in the ideal case, has a planar surface and abuts on the remaining planarization layer 150 in a flush manner. Preferably, the etching process here is selected such that the second metal layer 130 of the layer sequence 133 acts as an etch stop layer.

This embodiment of the present invention thus ensures that, when employing the bottom electrode in a BAW resonator, a high quality of the series resonance is achieved, since the entire resonator region reaches the resonant state at nearly the same frequency since the acoustic thickness has almost no local variations.

The layer sequence 133 of the bottom electrode exemplarily comprises the following materials, namely aluminum for the first metal layer 110, TiN for the intermediate layer 120 and tungsten for the second metal layer 130. A silicon nitride material may suitably be used for the protective layer 140 and a silicon oxide material for the planarization layer 150. With this material selection, it is at the same time ensured that the (dry) etching process used for removing the protective layer is at the same time suitable for removing a part of the planarization layer and stops at the tungsten layer. At the same time, silicon nitride and silicon oxide have sufficiently equal etching rates. The present invention, however, is not limited to these materials, wherein other materials comprising equal etching rates may equally be employed.

The materials used are only to be taken as examples, but are not necessarily required for an inventive method. When selecting the layer thicknesses of the layer structure 133, it is to be kept in mind that the layer thickness of the layer structure 133 contributes to the acoustic thickness of the acoustic resonator. Since a standing acoustic wave forms in the acoustic resonator, a changed acoustic thickness directly influences the resonant frequency resulting. This resonant frequency may be adjusted by correspondingly selecting the layer thicknesses. Basically, this takes place by a corresponding selection of the layer thickness of the piezo layer, but also by a suitable selection of the layer thickness of the layers in the layer structure 133. Since the field in which the resonator may be employed may vary strongly (exemplarily from some MHz to several GHz), the layer thicknesses are to be selected correspondingly. It is exactly the layer thicknesses of all the layers used in the layer stack which define the frequency of the resonator. Since the field of usage with regard to the frequency is varied, the individual layer thicknesses vary very greatly.

In the embodiment chosen here, the bottom electrode consists of a layer sequence 133 of three layers. In further embodiments, the number of layers of the bottom electrode can be varied. The number and/or selection of the layers here is basically determined by processing or manufacturing. As has already been mentioned, the materials of the layers should be compatible with each other and also compatible with the abutting materials (i.e. with the basic material 100 and the piezoelectric material). In particular, sufficient adhesion of the materials used must be ensured. Suitable materials additionally excel in that they ensure a sufficient electrical contact to the piezoelectric layer and that they do not affect the acoustic characteristics of the resonator in a negative way.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing a bottom electrode in a piezoelectric device, the method comprising:
   (a) providing a substrate;
   (b) providing a layer structure on the substrate, the layer structure comprising a conductive material and a top protective layer;
   (c) applying a planarization layer on the protective layer and on the substrate;
   (d) exposing a portion of the protective layer by removing a portion of the planarization layer above the portion of the protective layer;
   (e) removing additional portions of the planarization layer such that the protective layer and the planarization layer form a first planar surface; and
   (f) removing the protective layer of the layer structure and a lateral corresponding portion of the planarization layer such that the planarization layer and the layer structure absent the protective layer form a second planar surface.

2. The method of claim 1 wherein the exposed portion of the protective layer in step (d) is a central portion of the protective layer.

3. The method of claim 2 wherein the step of exposing the central portion of the protective layer includes patterning the planarization layer such that ribs are formed in the patterned planarization layer above an edge region of the layer structure.

4. The method of claim 1 wherein, in step (f), removal of the layer structure and the lateral corresponding portion of the planarization layer result in the second planar surface with the planarization layer laterally abutting the layer structure absent the protective layer in a flush manner.

5. A method for manufacturing a patterned bottom electrode in a piezoelectric device, the method comprising:
   (a) providing a basic material;
   (b) providing a layer structure on the basic material, the layer structure comprising a conductive material, wherein a protective layer is provided on the layer structure;
   (c) applying a planarization layer on the protective layer and on the basic material;
   (d) patterning the planarization layer into a pattern, wherein a portion of the protective layer is exposed during patterning;
   (e) planarizing the pattern of step (d) by removing additional portions of the planarization layer in order for the protective layer and the planarization layer to laterally abut in a flush manner and to form a planar surface of the protective layer and the planarization layer; and
   (f) removing the protective layer and a corresponding part of the planarization layer laterally arranged to the protective layer in a flush manner in order to obtain a planar surface of the layer structure and the planarization layer.

6. The method of claim 5 wherein step (f) of removing comprises an equal removing rate for the planarization layer and the protective layer.

7. The method of claim 5 wherein step (f) of removing comprises an etching process, and wherein protective layer includes a material that has the same etching rates as the planarization layer.

8. The method of claim 5 wherein in step (c) the planarization layer comprises a layer thickness exceeding a layer thickness of the layer structure and the protective structure.

9. The method of claim 5 wherein in step (c) the planarization layer comprises a layer thickness corresponding to a layer thickness of the layer structure and the protective layer.

10. The method of claim 5 wherein step (d) comprises an etching process.

11. The method of claim 5 wherein step (b) additionally comprises smoothing the layer structure.

12. A method for manufacturing a bottom electrode, the method comprising:
    (a) providing a basic material;
    (b) providing a layer structure on the basic material, the layer structure comprising a first metal layer, a second metal layer, a connective layer and a protective layer, the connective layer being applied between the first metal layer and the second metal layer, the first metal layer being applied on the basic material and the protective layer being applied on the second metal layer;
    (c) applying a planarization layer on the protective layer and on the basic material;
    (d) exposing a portion of the protective layer by removing a portion of the planarization layer;
    (e) planarizing the protective layer by removing the portions of the planarization layer remaining outside the portion in order for the protective layer and the planarization layer to laterally abut in a flush manner and to form a planar surface; and (f) removing the protective layer and a corresponding part of the planarization layer laterally arranged to the protective layer in a flush manner in order to obtain a planar surface of the layer structure and the planarization layer.

13. The method of claim 12 wherein in step (c) the planarization layer has a layer thickness corresponding to a layer thickness of the layer structure and the protective layer.

14. The method of claim 12 wherein in step (c) the planarization layer has a layer thickness exceeding a layer thickness of the layer structure and the protective layer.

15. The method of claim 12 wherein step (f) of removing comprises an etching process and the protective layer includes a material that has the same etching rates as the planarization layer.

16. The method of claim 12, wherein step (b) of producing additionally comprises smoothing the second metal layer.

17. The method of claim 12 wherein step (b) of producing comprises the following sub-steps,
patterning the first metal layer;
patterning the connective layer; and
patterning the second metal layer.

18. The method of claim 12 wherein the first metal layer comprises aluminum and the second metal layer comprises tungsten.

19. The method of claim 12 wherein the intermediate layer comprises titanium nitride.

20. The method of claim 12 wherein the planarization layer comprises silicon oxide and the protective layer comprises silicon nitride.

* * * * *